US 8,378,419 B2

(12) United States Patent
Anderson et al.

(10) Patent No.: US 8,378,419 B2
(45) Date of Patent: Feb. 19, 2013

(54) ISOLATION FET FOR INTEGRATED CIRCUIT

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 12/951,575

(22) Filed: Nov. 22, 2010

(65) Prior Publication Data

US 2012/0126336 A1   May 24, 2012

(51) Int. Cl.
*H01L 29/94* (2006.01)
*H01L 31/062* (2006.01)
*H01L 31/113* (2006.01)
*H01L 31/119* (2006.01)

(52) U.S. Cl. ........................ 257/329; 438/400

(58) Field of Classification Search .............. 257/392, 257/E27.06, E21.54; 438/400
See application file for complete search history.

(56) References Cited

U.S. PATENT DOCUMENTS

| | | | |
|---|---|---|---|
| 6,803,278 B2 * | 10/2004 | Tran | 438/258 |
| 6,812,149 B1 | 11/2004 | Wang et al. | |
| 7,049,185 B2 | 5/2006 | Ito | |
| 7,525,173 B2 | 4/2009 | Yang et al. | |
| 7,569,887 B2 | 8/2009 | Otsuki | |
| 7,671,469 B2 | 3/2010 | Lee et al. | |
| 2005/0169052 A1 * | 8/2005 | Hsu et al. | 365/185.03 |
| 2006/0125024 A1 * | 6/2006 | Ishigaki | 257/390 |
| 2008/0079088 A1 | 4/2008 | Kudo | |
| 2010/0148248 A1 | 6/2010 | Mikasa | |
| 2010/0193877 A1 | 8/2010 | Liaw | |
| 2011/0147765 A1 * | 6/2011 | Huang et al. | 257/77 |

* cited by examiner

*Primary Examiner* — Phuc Dang

(74) *Attorney, Agent, or Firm* — Cantor Colburn LLP; Michael LeStrange

(57) ABSTRACT

An integrated circuit (IC) includes an active region; a pair of active field effect transistors (FETs) in the active region; and an isolation FET located between the pair of active FETs in the active region, the isolation FET configured to provide electrical isolation between the pair of active FETs, wherein the isolation FET has at least one different physical parameter or electrical parameter from the pair of active FETs.

19 Claims, 5 Drawing Sheets

ISOLATION FET FOR INTEGRATED CIRCUIT

BACKGROUND

This disclosure relates generally to the field of integrated circuit (IC) manufacturing, and more specifically to an isolation gate for electrical isolation between semiconductor devices on an IC.

ICs are formed by connecting isolated active devices, which may include semiconductor devices such as field effect transistors (FETs), through specific electrical connection paths to form logic or memory circuits. Therefore, electrical isolation between active devices is important in IC fabrication. A shallow trench isolation (STI) region may be formed in the IC substrate between two active devices to electrically isolate the active devices. An STI region may be formed by forming a trench in the substrate between the active devices by etching, and then filling the trench with an insulating material, such as an oxide. After the STI trench is filled with the insulating material, the surface profile of the STI region may be planarized by, for example, chemical mechanical polishing (CMP).

Edge FETs may have increased non-uniformity due to effects such as different size source/drain (S/D) regions. Placement variation of the gate to silicon edge affects the S/D region size. This variation in S/D region can affect doping profiles, strain levels, and epitaxial growth rates. Dummy gates may be formed at the transition region between an STI and the active silicon to assist with maintaining device uniformity. The dummy gates are formed at each silicon edge; i.e., one dummy gate is located on either edge of the STI region, as is shown in IC 100 of FIG. 1. FIG. 1 illustrates a cross section of an IC 100 having dual dummy gates 103a-b and STI region 104 between active gates 102a-b. Active gates 102a-b are on active regions 101a-b. Active regions 101a-b each include a source, a channel, and a drain region for each of the active gates 102a-b, respectively, to form two active FETs. The devices including active regions 101a-b, with respective active gates 102a-b, are electrically isolated by STI region 104. STI region 104 is filled with an insulating material such as an oxide. An IC such as IC 100 with dual dummy gates 103a-b has a spacing between active regions 101a-b that is about two device pitches. Such spacing between active devices results in an IC having a relatively low device density.

SUMMARY

In one aspect, an IC includes an active region; a pair of active field effect transistors (FETs) in the active region; and an isolation FET located between the pair of active FETs in the active region, the isolation FET configured to provide electrical isolation between the pair of active FETs, wherein the isolation FET has at least one different physical parameter or electrical parameter from the pair of active FETs.

In another aspect, a method of making an IC includes forming an isolation field effect transistor (FET) in an active region of the IC, the isolation FET being located between a pair of active FETs and configured to provide electrical isolation between the pair of active FETs, wherein the isolation FET has at least one different physical parameter or electrical parameter from the pair of active FETs.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Figure 1:
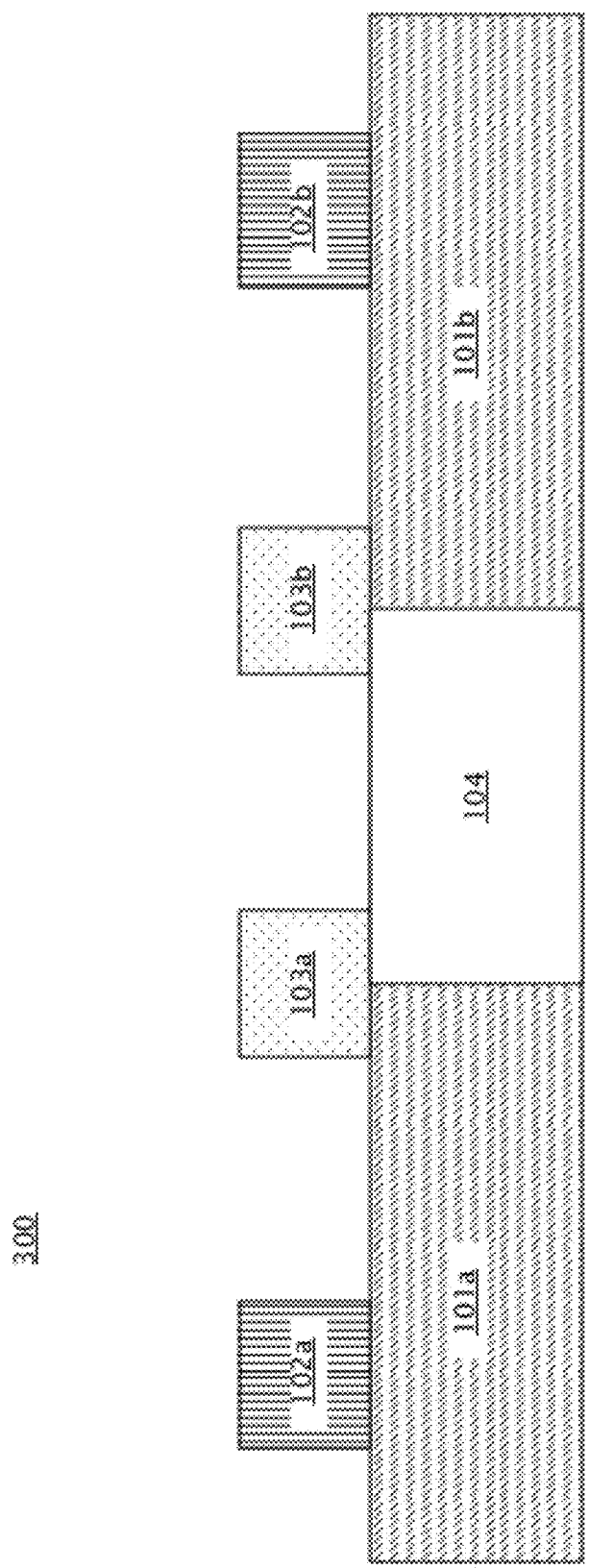
FIG. 1 a cross section of an embodiment of a prior art IC with dual dummy gates and an STI between active devices.

Embodiments of an isolation FET for an IC are provided, with exemplary embodiments being discussed below in detail. An isolation gate for an isolation FET may be formed on an active region of an IC between two active gates in place of an STI and dual dummy gates. The isolation FET acts to electrically isolate the active devices from one another. Formation of isolation gates between the active gates may provide relatively uniform gate dimensions for an IC. The active device density of the IC may also be increased by use of isolation FETs; the area necessary for a chip with a single isolation FET between active devices may be reduced by about 20% in some embodiments as compared to an IC with STI regions and dual dummy gates. Strain uniformity, doping profiles, epitaxial growth rates are examples of device parameters of the IC that may be improved, due to the absence of STI regions between active devices. All devices in the IC may have uniform strain, with source/drain regions that are uniform in height, which reduces the complexity of forming source/drain contacts on the IC. Isolation gates may be used in an IC that includes any appropriate type of semiconductor devices, for example, FETs or FinFETs.

An isolation gate acts as an FET gate for a portion of the active region of the IC to form the isolation FET. The isolation FET includes a source, a channel, and a drain that are located underneath the isolation gate in the active region of the IC. The isolation FET stays turned off during IC operation to provide isolation between the active devices located on either side of the isolation gate. This may be achieved by engineering the relative threshold voltage (Vt) of the isolation FET versus the Vt of the active devices. The Vt of a FET is a voltage that is applied to the FET gate at which the FET changes state between on and off. The isolation gate is formed such that the isolation FET has a Vt that is higher than the Vt of the active devices. The isolation gate does not experience any voltages that are higher than the Vt of the isolation FET during IC operation, allowing the isolation FET to stay turned off.

The Vt of the isolation FET may be raised relative to the active devices in any appropriate manner. Modification of one or more physical or electrical characteristics of the isolation FET may be performed to raise the isolation FET Vt. Additionally or alternately, modification one or more physical or electrical characteristics of the active devices may be performed to lower the active device Vt, while not lowering the Vt of the isolation FET. Some example characteristics in which the isolation FET may differ from the active FETs include: inclusion of source/drain extensions, omission of source/drain extensions, source/drain doping levels, gate dielectric thickness, gate length, strain, gate workfunction, silicided source/drains, or lack of silicided source/drains. An isolation gate may also be connected to a voltage source selected to keep the isolation FET in the off state during IC operation.

Figure 2:
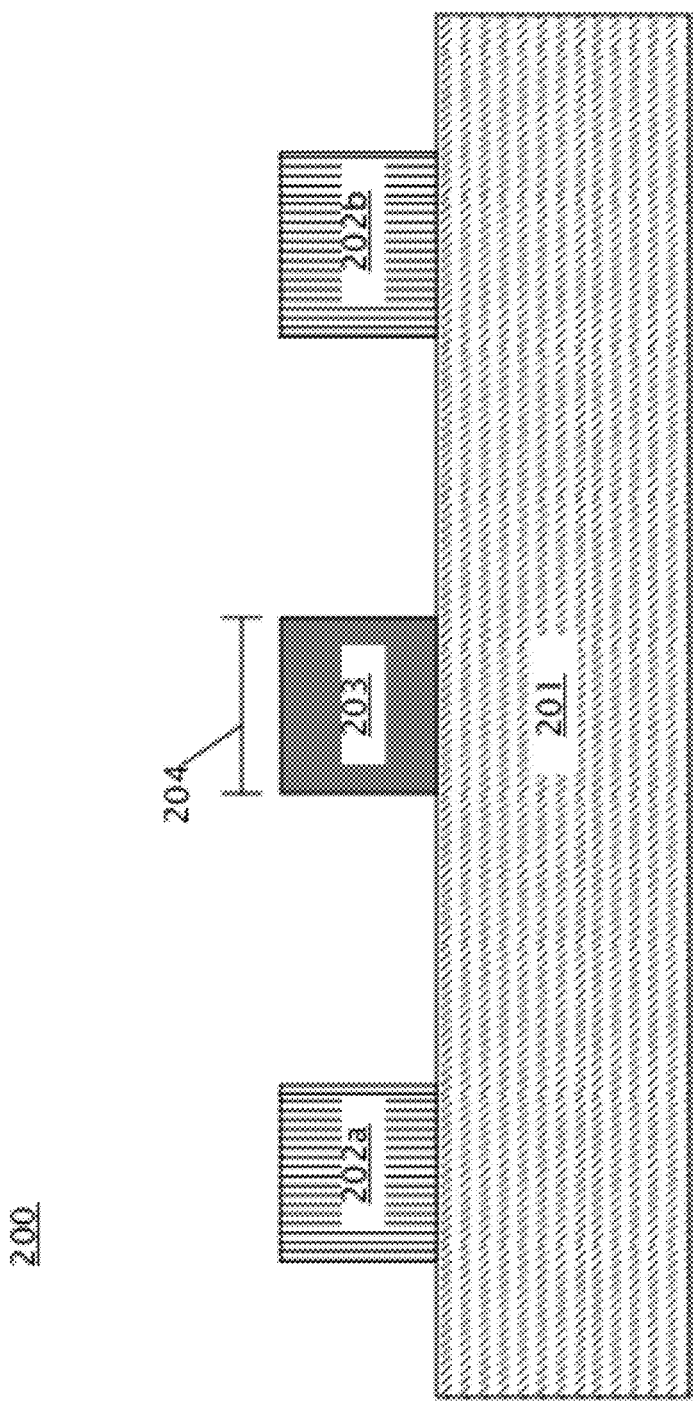
FIG. 2 illustrates a cross section of an embodiment of an IC with an isolation FET between active devices.

FIG. 2 illustrates a cross section of an embodiment of an IC 200 with an isolation gate 203 between active gate 202a-b on active region 201. Active region 201 includes various source, drain, and channel regions that form two active FETs, each gated by one of active gates 202a-b, and an isolation FET gated by isolation gate 203. The isolation FET gated by isolation gate 203 is configured such that the isolation FET stays turned off during operation of IC 200, providing isolation between the active FETs gated by active gates 202a-b; this may be achieved by one or more of the following techniques. The Vt of the isolation FET gated by isolation gate 203 may be raised by implantation of the isolation gate 203 with a substance selected to raise the Vt of the isolation FET. The isolation FET may be masked during an extension implant of the active gates 202a-b to lower the Vt of the active FETs. The active gates 202a-b may be implanted with a substance selected to lower the Vt of the active FETs while not lowering the Vt of the isolation gate 203. The active FETs may include source/drain extensions that are not present in the isolation FET. The isolation gate 203 may be formed with a thicker dielectric layer than the active gates 202a-b, so as to raise the Vt of the isolation FET, and to reduce gate leakage and capacitance between the active FETs. The isolation gate 203 may have a longer gate length (indicated by line 204) than the active gates 202a-b, which may act to raise the Vt of the isolation FET. The isolation gate 203 workfunction may be higher than the active gate 202a-b workfunction, giving the isolation FET a higher Vt. The isolation gate 203 workfunction type may be selected such that the isolation FET is of an opposite type (n-type or p-type) to the active FETs. Strain may be induced in the active FETs to lower the active FET Vt. The strain may be of any appropriate type, including but not limited to epitaxial strain, oxidation strain, nitride strain, or implant strain. Any appropriate type of strain may be applied to the active FETs so as to lower the active FET Vt. Any appropriate combination of the above techniques may be applied to an isolation FET or an active FET to ensure that the isolation FET stays turned off during the operation of the IC.

Figure 3:
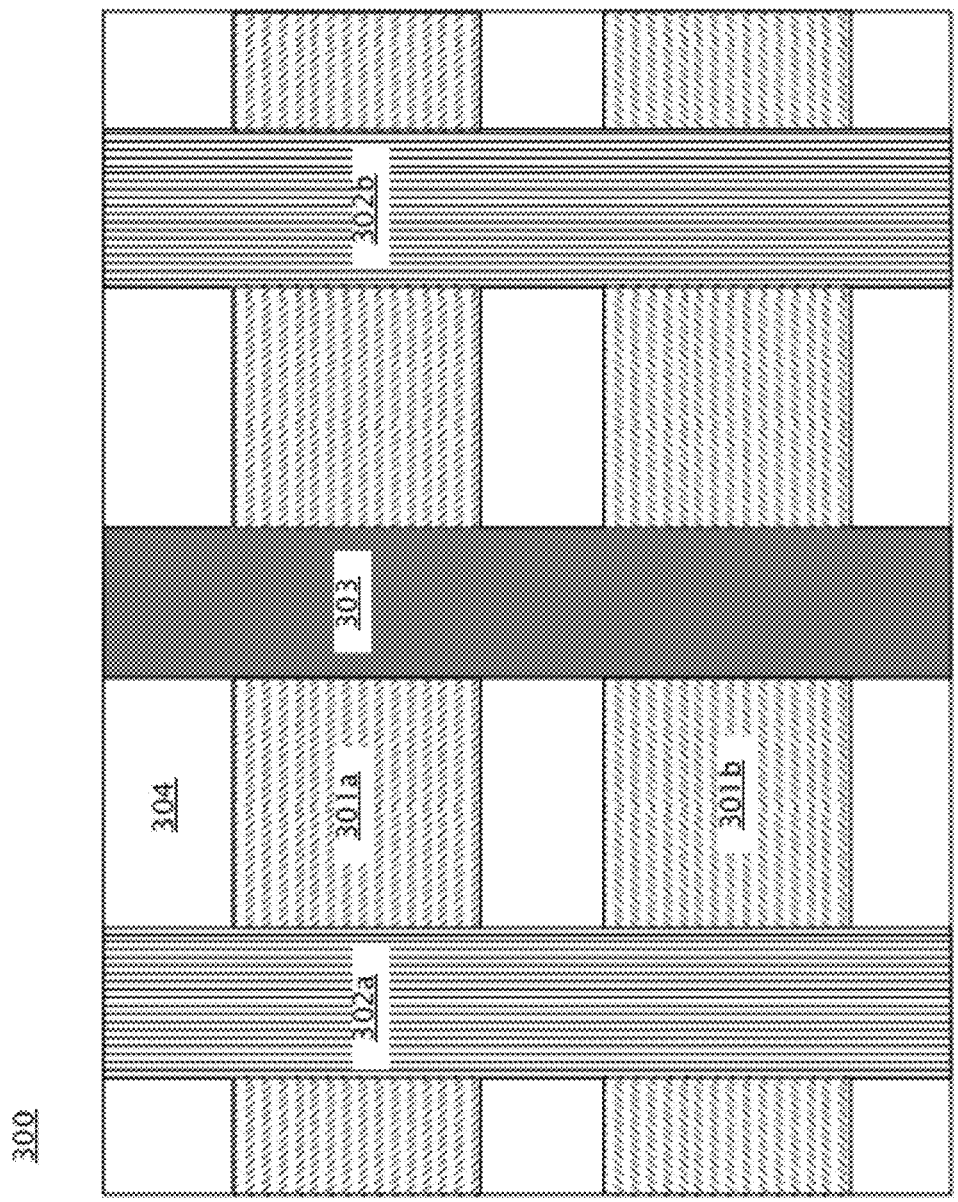
FIG. 3 illustrates a top view of an embodiment of an IC with an isolation FET between active devices.

FIG. 3 illustrates a top view of an embodiment of an IC 300 with an isolation gate 303 between active gates 302a-b in active regions 301a-b. The IC 300 includes two active regions, 301a-b, separated by STI regions 304. Active region 301a may have a type (n-type or p-type) that is opposite a type of active region 301b in some embodiments. Active regions 301a-b include various source, drain, and channel regions. Isolation gate 303 forms an isolation FET in each of active regions 301a-b, and active gates 302a-b each form an active FET in each of active regions 301a-b on either side of the isolation FETs. The isolation FETs gated by isolation gate 303 provides isolation between the active FETs gated by active gates 302a-b by staying turned off during operation of IC 300; this may be achieved by applying one or more of the techniques discussed above with respect to FIG. 2 to the active FETs gated by active gates 302a-b and/or the isolation FETs gated by isolation gate 303. STI regions 304 may include trenches filled with an insulating material, and are only necessary between active regions 301a-b, not between active devices within active regions 301a-b. ICs 200 and 300 may exhibit relatively high device density, and may have improved strain uniformity and manufacturability versus an IC that includes STI regions between active devices in the active regions due to the absence of STI regions between active devices in the active regions.

Figure 4:
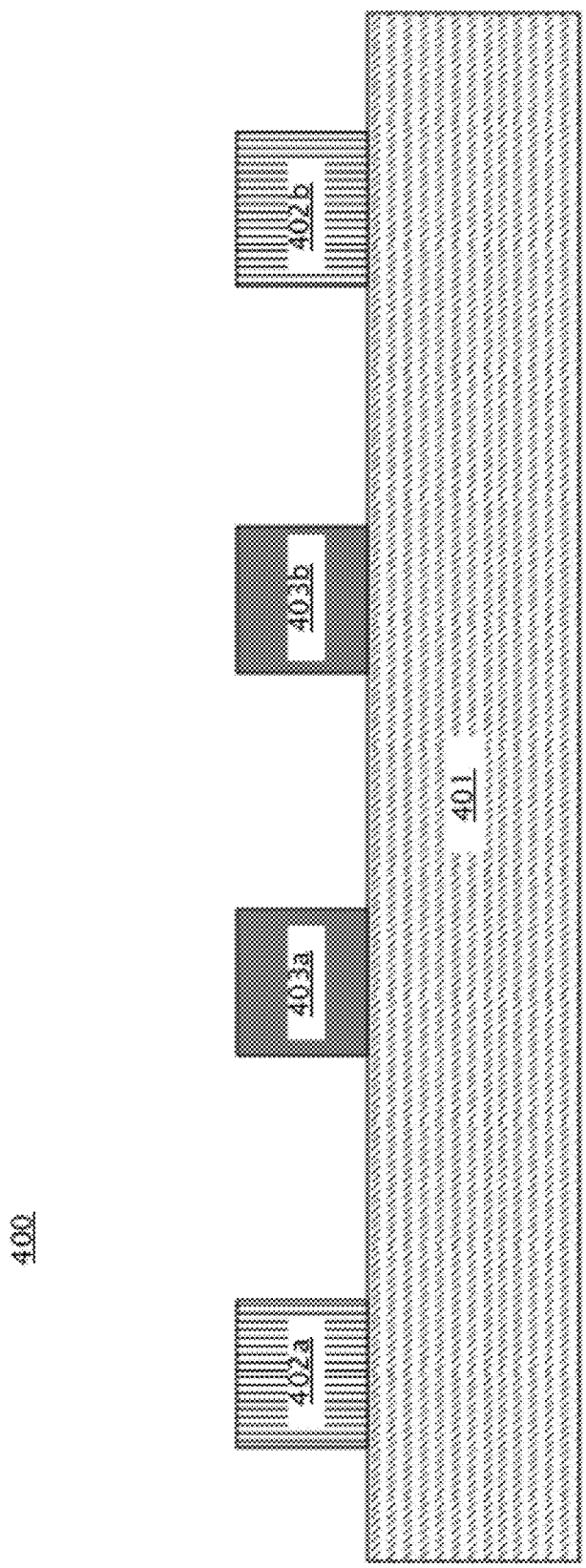
FIG. 4 illustrates a cross section of an embodiment of an IC with dual isolation FETs between active devices.

Dual isolation gates may be formed between active devices in some embodiments for ICs that require very low leakage conditions between active devices. FIG. 4 illustrates a cross section of an embodiment of an IC 400 with two isolation gates 403a-b located between active gates 402a-b on active region 401. Active region 401 includes source, drain, and channel regions that form two active FETs, each active FET gated by one of active gates 402a-b, and two isolation FETs, each isolation FET gated by one of isolation gates 403a-b. The isolation FETs gated by isolation gates 403a-b provide isolation between the active FETs gated by active gates 402a-b by staying turned off during operation of IC 400; this may be achieved by applying one or more of the techniques discussed above with respect to FIG. 2 to the active FETs gated by active gates 402a-b and/or the isolation FETs gated by isolation gates 403a-b.

Figure 5:
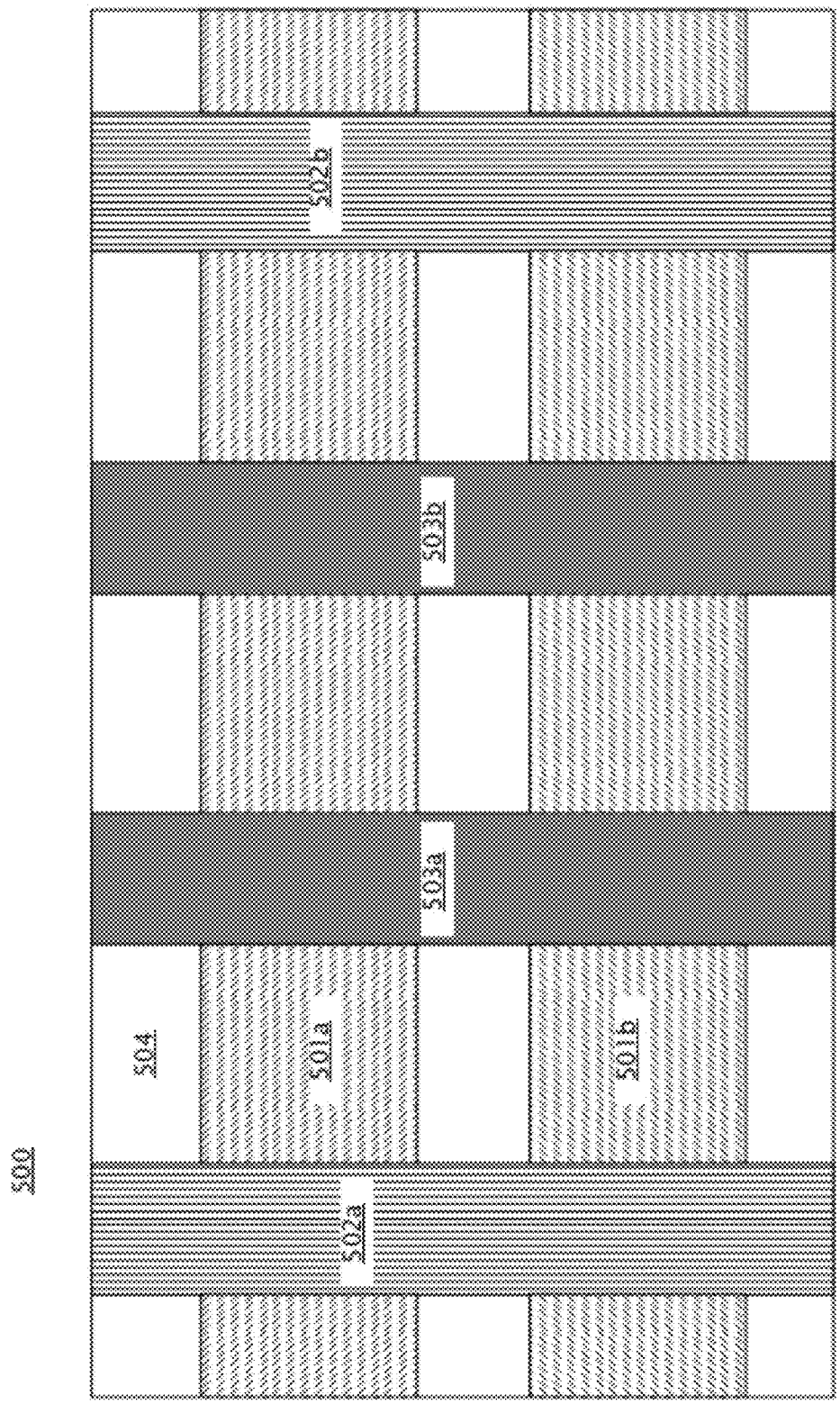
FIG. 5 illustrates a top view of an embodiment of an IC with dual isolation FETs between active devices.

FIG. 5 illustrates a top view of an embodiment of an IC 500 with two isolation gates 503a-b between active gates 502a-b in active regions 501a-b. The IC 500 includes two active regions, 501a-b, separated by STI regions 504. Active region 501a may have a type (n-type or p-type) that is opposite a type of active region 501b in some embodiments. Active regions 501a-b include various source, drain, and channel regions gated by isolation gates 503a-b and active gates 502a-b. Isolation gates 503a-b each form an isolation FET in each of active regions 501a-b, and active gates 502a-b each form an active FET in each of active regions 301a-b on either side of the isolation FETs. The isolation FETs gated by isolation gates 503a-b provide isolation between the active FETs gated by active gates 502a-b by staying turned off during operation of IC 500; this may be achieved by applying one or more of the techniques discussed above with respect to FIG. 2 to the active FETs gated by active gates 502a-b and/or the isolation FETs gated by isolation gates 503a-b. STI regions 504 may include trenches filled with an insulating material, and are only necessary between active regions 501a-b, not between active devices. ICs 400 and 500 with dual isolation gates may have low electrical leakage between active devices, and improved strain uniformity and manufacturability versus an IC that includes STI regions between active devices in the active regions due to the absence of STI regions between active devices in the active regions.

The technical effects and benefits of exemplary embodiments include increased device density and uniformity in an IC.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. An integrated circuit (IC), comprising:
   an active region;
   a pair of active field effect transistors (FETs) in the active region; and
   an isolation FET located between the pair of active FETs in the active region, the isolation FET configured to provide electrical isolation between the pair of active FETs, and wherein the isolation FET has at least one different physical parameter or electrical parameter from the pair of active FETs, wherein the physical parameter comprises the active FETs having source and drain regions with source/drain extensions, and wherein the isolation FET has source and drain regions that do not have source/drain extensions.

2. The IC of claim 1, wherein the isolation FET is configured such that the isolation FET stays turned off during operation of the IC.

3. The IC of claim 1, wherein the electrical parameter comprises the isolation FET having a threshold voltage that is higher than a threshold voltage of the pair of active FETs.

4. The IC of claim 1, wherein the physical parameter comprises a strain being applied to the active FET, the strain being selected such that the strain causes a threshold voltage of the isolation FET to be higher than a threshold voltage of the active FETs.

5. The IC of claim 4, wherein the strain comprises at least one of epitaxial strain, oxidation strain, nitride strain, and implant strain.

6. The IC of claim 1, wherein the electrical parameter comprises the isolation FET having gate workfunction that is higher than a gate workfunction of the pair of active FETs.

7. The IC of claim 1, wherein the physical parameter comprises the pair of active FETs having silicided source and drain regions, and wherein the isolation FET does not having silicided source/drain regions.

8. The IC of claim 1, wherein the electrical parameter comprises a voltage source connected to a gate of the isolation FET, the voltage source selected to keep the isolation FET in the off state during operation of the IC.

9. The IC of claim 1, wherein the physical parameter comprises the isolation FET having a gate dielectric layer that is thicker than a gate dielectric layer of each of the active FETs.

10. The IC of claim 1, wherein the physical parameter comprises a gate of the isolation FET having a gate length that is longer than a gate length of a gate of each of the active FETs.

11. The IC of claim 1, wherein the electrical parameter comprises the isolation FET having a type that is opposite to a type of the pair of active FETs.

12. The IC of claim 1, wherein the physical parameter comprises differing source/drain doping levels between the isolation FET and the pair of active FETs, the differing source/drain doping levels being selected such that the difference in source/drain doping levels causes a threshold voltage of the isolation FET to be higher than a threshold voltage of the active FETs.

13. The IC of claim 1, wherein no dielectric isolation is located between the isolation FET and the pair of active FETs.

14. The IC of claim 1, wherein the IC comprises two isolation FETs located between the pair of active FETs.

15. A method of making an integrated circuit (IC), comprising:
   forming an isolation field effect transistor (FET) in an active region of the IC, the isolation FET being located between a pair of active FETs and configured to provide electrical isolation between the pair of active FETs, and wherein the isolation FET has at least one different physical parameter or electrical parameter from the pair of active FETs, wherein the electrical parameter comprises a voltage source connected to a gate of the isolation FET, the voltage source selected to keep the isolation FET in the off state during operation of the IC.

16. The method of claim 15, further comprising the isolation FET staying turned off during operation of the IC.

17. The method of claim 15, wherein the electrical parameter comprises the isolation FET having a threshold voltage that is higher than a threshold voltage of the pair of active FETs.

18. The method of claim 15, wherein the electrical parameter comprises the isolation FET having gate workfunction that is higher than a gate workfunction of the pair of active FETs.

19. An integrated circuit (IC), comprising:
   an active region;
   a pair of active field effect transistors (FETs) in the active region; and
   an isolation FET located between the pair of active FETs in the active region, the isolation FET configured to provide electrical isolation between the pair of active FETs, and wherein the isolation FET has at least one different physical parameter or electrical parameter from the pair of active FETs, wherein the physical parameter comprises differing source/drain doping levels between the isolation FET and the pair of active FETs, the differing source/drain doping levels being selected such that the difference in source/drain doping levels causes a threshold voltage of the isolation FET to be higher than a threshold voltage of the active FETs.

\* \* \* \* \*